United States Patent [19]

Prior et al.

[11] Patent Number: 5,418,800
[45] Date of Patent: May 23, 1995

[54] REDUCED LINEWIDTH FROM AN ELECTRICALLY COUPLED TWO SECTION SEMICONDUCTOR LASER

[75] Inventors: Lehiam Prior; Boris M. Chernobrod, both of Rehovot, Israel

[73] Assignee: Yeda Research and Development Co. Ltd., Rehovot, Israel

[21] Appl. No.: 141,739

[22] Filed: Oct. 27, 1993

[51] Int. Cl.[6] .................................................. H01S 3/19
[52] U.S. Cl. ......................................... 372/45; 372/46
[58] Field of Search .............................. 372/45, 46, 50

[56] References Cited

U.S. PATENT DOCUMENTS

| | | | |
|---|---|---|---|
| 4,802,182 | 1/1989 | Thornton et al. | 372/45 |
| 4,823,352 | 4/1989 | Sugimoto | 372/46 |
| 4,961,198 | 10/1990 | Ishino et al. | 372/50 |
| 4,977,567 | 12/1990 | Hanke | 372/45 |
| 5,001,522 | 3/1991 | Takahashi et al. | 372/45 |
| 5,005,176 | 4/1991 | Lam et al. | 372/45 |
| 5,103,455 | 4/1992 | Eichen et al. | 372/46 |
| 5,179,615 | 1/1993 | Tanaka et al. | 372/45 |
| 5,305,343 | 4/1994 | Allovon et al. | 372/45 |

OTHER PUBLICATIONS

Single-mode Very Wide Tunability in Laterally Coupled Semiconductor Lasers with Electrically Controlled Reflectivities G. Griffel, H. Z. Chen, I. Grave, A. Yariv, Phys. Lett. vol. 58(17), p. 1827, Jan. 1991.

"Quantum Correlation Between the Junction-Voltage Fluctuation and the Photon-Number Fluctuation in a Semiconductor Laser," by W. H. Richardson et al., Physical Review Letters, vol. 66, No. 15, Apr. 15, 1991, pp. 1963-1966.

"Use of Quantum-Noise Correlation for Noise Reduction in Semiconductor Lasers," by A. Karlsson et al., Physical Review A, vol. 44, No. 11, Dec. 1, 1991, pp. 7669-7683.

"Measurements and Theory of Correlation Between Terminal Electrical Noise and Optical Noise in a Two-Section Semiconductor Laser," by E. Goobar et al., IEEE Journal of Quantum Electronics, vol. 29, No. 2, Feb. 1993, pp. 386-395.

Primary Examiner—Rodney B. Bovernick
Assistant Examiner—Robert E. Wise
Attorney, Agent, or Firm—Keck, Mahin & Cate

[57] ABSTRACT

A two part semiconducting laser having a gain part including a junction and a relatively thin phase part. A partially reflective mirror is on the exterior of the phase part. The junction voltage is sensed and processed to obtain a control signal that is applied to the phase part to control the reflectivity of the mirror, in order to reduce the linewidth to below the Henry linewidth and down to the ST limit.

9 Claims, 1 Drawing Sheet

REDUCED LINEWIDTH FROM AN ELECTRICALLY COUPLED TWO SECTION SEMICONDUCTOR LASER

FIELD OF THE INVENTION

The present invention relates to a method and apparatus (device) for producing a reduced linewidth from an electrically coupled two section semiconductor laser.

BACKGROUND OF THE INVENTION

Narrow spectral linewidth of semiconductor (SC) lasers is of great importance for many applications, such as optical communication systems, interferometric fiber sensors, etc. The nature of most applications is such that a small monolithic device is desired, a property that may not always be accommodated with the narrow linewidth required. Like any other laser, a SC laser may operate in a number of longitudinal modes, which are the allowed frequencies dictated by the optical resonator. Since these lasers are normally very small (typically much less than 1 mm) the mode spacing is large, and optical methods such as grating feedback are used to select a single mode for the operation of the laser. Even a laser operating in a single longitudinal mode still possesses a finite linewidth, as determined by fundamental physical processes involved in the lasing action itself.

For any laser, the ultimate linewidth is determined by the Schawllow-Townes (ST) limit, which is a manifestation of the process of spontaneous emission as it affects the laser linewidth. In SC lasers the fundamental limit is higher, due to the very strong coupling between intensity and phase fluctuations in these lasers. According to the well established Henry theory [C. H. Henry, "Theory of the phase noise and power spectrum of a single mode injection laser", IEEE J. Quantum Electron. vol. QE-19, 1391–1397, (1983)] the lineshape and linewidth of a single-mode SC laser are defined by refractive index fluctuations, induced by the gain changes due to the fluctuations in the number of carriers. In SC lasers the dispersion curve of the refractive index is shifted from the gain-peak frequency, so that the change of the imaginary part of the susceptibility (gain) is accompanied by a corresponding change in its real part (refractive index) via the Kramers-Kronig relations. Both the gain and the refractive index depend on the carrier number, and carrier number fluctuations caused by spontaneous emission induce refractive index changes.

For Gaussian statistics of fluctuations, the field correlation function is $$\langle E(t)E(0)\rangle = \exp(-\tfrac{1}{2}\langle\Phi(t)^2\rangle) \tag{1}$$

Where $\Phi(t)$ is the field phase. According to Henry, $$\langle\Phi(t)^2\rangle = R/(2I)((1+\alpha^2)t+\alpha^2/(2\Gamma)(1-\exp(-\Gamma t)\cos(\Omega t))) \tag{2}$$

Here, $R$ is the spontaneous emission rate, $I$ is the steady state photon number, $\Gamma$ and $\Omega$ are the damping rate and the frequency of the relaxation oscillations (RO), $\alpha$ is the enhancement factor. The term in (2) which has linear dependence on time is connected with the long time fluctuations of the carrier number. The oscillating term is connected with the RO of the carrier number and of the intensity, which results from the return to steady state after perturbation. The linear term defines the linewidth.

$$\Delta\omega = R/(2I)(1+\alpha^2) \tag{3}$$

Where $R/(2I)$ is the ST width. The parameter $\alpha^2$ ranges in value between 5–50 for various type of lasers, so that a method by which the long time fluctuations of carrier number are suppressed provides a narrowing of linewidth by the same factor.

The most common approach to spectral line narrowing is based on optical feedback from an external cavity ("External optical feedback effects on semiconductor injection laser properties", R. Lang and K. Kobayashi, IEEE J. Quantum Electron. vol. QE-16, p. 347, 1980). Due to the improved quality factor attainable with external cavities, the coupling to an external cavity provides significant linewidth reduction and improved frequency stability ("Stable semiconductor laser with a 7-Hz linewidth by an optical-electrical double-feedback technique", C. H. Shin and M. Ohtsu, Opt. Lett. vol. 15, p. 1455, 1990). The realizations of this approach, however, requires a cavity outside the monolithic semiconductor device, and a resonator which is much larger and does not reside on the laser chip, a property not compatible with various applications.

In a SC laser, intensity noise results from the fluctuations in the number of carriers in the laser material, and several authors have studied the correlation between laser noise and carrier number fluctuations. It has been shown that the number of carriers, as well as the frequency and/or intensity fluctuations are strongly correlated to the junction voltage (JV), and indeed the junction voltage has been used for the purpose of stabilizing intensity and frequency noise in SC lasers ("Quantum correlation between the junction-voltage fluctuation and the photon-number fluctuation in a semiconductor laser", W. H. Richardson and Y. Yamamoto, Phys. Rev. Lett. vol 66, p. 1963, 1991; "Use of quantum-noise correlation for noise reduction in semiconductor lasers", A. Karlsson, and G. Bjork, Phys. Rev. A, vol. 44, p. 7669, 1991.). The correlation between JV noise and intensity or frequency noise in a two-section DBR semiconductor laser was measured, and stabilization possibilities were discussed. ("Measurements and theory of correlation between terminal electrical noise and optical noise in a two-section semiconductor laser", E. Goobar, A. Karlsson, and S. Machida, IEEE J. Quantum Electron. vol. 29, p. 386, 1993.).

It is also established that the phase and magnitude of the reflection from the surface of a semiconductor may be controlled accurately by an external voltage which is applied to a properly wired section near the face of the semiconductor ["Single-mode very wide tunability in laterally coupled semiconductor lasers with electrically controlled reflectivities", G. Griffel, H. Z. Chen, I. Grave, A. Yariv, Appl. Phys. Lett. vol. 58(17), p. 1827, 1991].

The above mentioned stabilization methods are capable of reducing excess frequency noise, and lowering the laser linewidth to the limit dictated by the Henry theory (the "Henry" linewidth) for single mode SC lasers. The externally stabilized lasers reach a limit much lower than the one derived from the Henry theory, but in most cases still higher than the ST limit. In addition, the external cavity stabilization is not acceptable for many applications because the obtained device is no longer monolithic, and the optical cavity is large and cumbersome.

SUMMARY OF THE INVENTION

It is the object of the present invention to provide a two section laser, where one section is used as the "gain" section, while the other section is used as the "phase" section, affecting the reflection of the adjacent mirror.

It is further the object of the present invention to provide a method of stabilizing a laser by feeding an electrical signal to the phase section of the laser, whereby the electrical signal is derived from the junction voltage measured on the gain section.

It is further the object of the present invention to provide a method of converting the measured junction voltage to a useful voltage signal which can be fed back to the phase section of the laser so that linewidth narrowing may be achieved.

It is further the object of the present invention to provide a method of frequency or phase stabilizing a SC laser such that the linewidth of the laser is below that of a SC laser at its Henry linewidth.

It is further the object of the present invention to provide a method of operating a SC laser at or near its ST limit.

It is further the object of the present invention to provide a monolithic device, where all functions of the device are on a single chip, including the gain section, the phase section, the JV measurement terminals and circuit, the signal analysis circuits, and the feedback loops and amplifiers and related circuitry.

DETAILED DESCRIPTION OF PREFERRED EMBODIMENTS OF THE INVENTION

Figure 1:
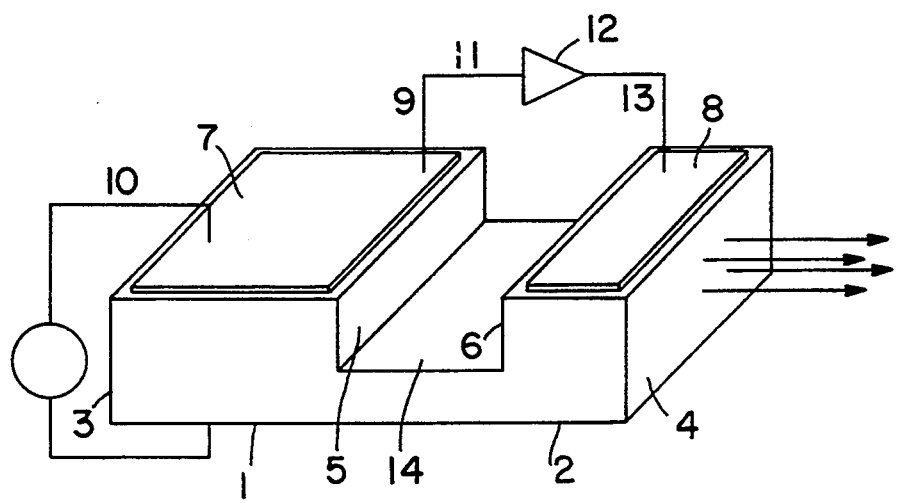
FIG. 1 is a schematic view of a two section laser arranged according to the invention.
Figure 2:
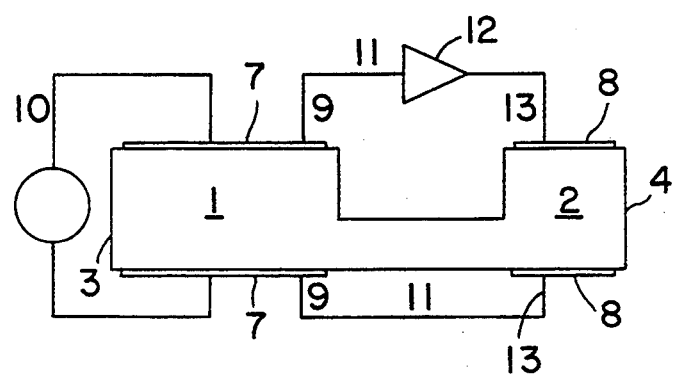
FIG. 2 is a simplified schematic of FIG. 1.
Figure 3:
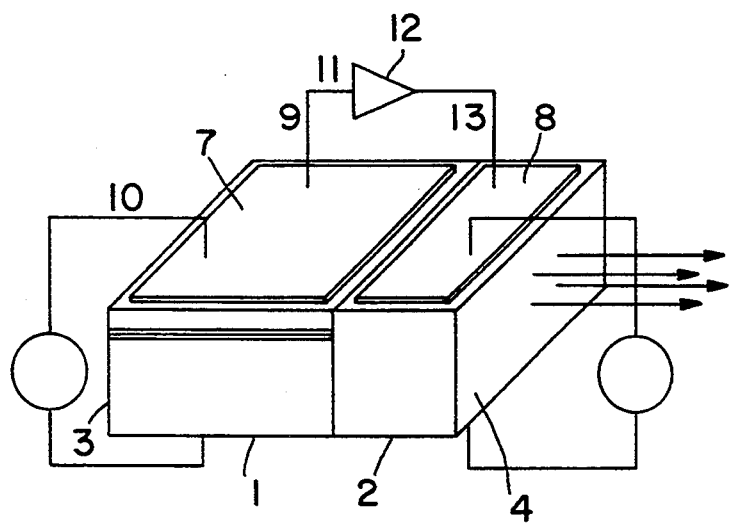
FIG. 3 is a schematic view of a two section laser with a quantum well arranged according to the present invention.

Examples of the proposed two part semiconductor laser structure is depicted in FIGS. 1, 2 and 3. The laser may be any type of known semiconducting laser, not including a quantum well laser (FIGS. 1 and 2) or including a quantum well (FIG. 3), where the nature of the lasing mechanism is not an essential part of the action of the present device. Many such two part semiconductor laser structures are known in the art and the invention applies to them all. Since the structure and function of such two part semiconducting lasers is so well known, a detailed description is unnecessary. Essentially, the laser consists of the two sections, the gain section [1] and the phase section [2]. The laser includes two mirrors, one on the gain side [3] and one on the phase section side [4]. The phase section is optically thin, and is adjacent to the mirror [4]. In the embodiment of FIGS. 1 and 2, the two intermediate surfaces [5] and [6] are not essential, and if exposed are coated with an antireflection coating at the wavelength of the operation of the laser. The gain section includes two electrodes for the injection of the pumping current [7], and if needed two other electrodes for the measurement of the junction voltage (JV) (not shown). The phase section also includes two electrodes [8] for the application of the control voltage. The gain section includes a circuit for the measurement of the JV [9], which is separate from the circuit for the injection of the pumping current [10]. The JV extracted from the gain section is directed to a processing circuitry [11], which is responsible for the processing of the junction voltage, and is converted to the form required by the method described in the text. The circuit [11] may include integrating, differentiating elements, or other components as needed. The circuit may also include input from the outside [12], possibly from a computer, which reflects additional information about the pumping current, temperature, or any other variable or constant parameter of the system. The control voltage is applied to the electrodes of the phase section via a dedicated circuitry [13] for the purpose of controlling the reflection of the mirror [4]. The mirror [3] may be a total reflector, which mirror [4] may be a partial reflector, allowing a fraction of the light to exit the laser cavity.

This invention deals with a scheme which provides linewidth reduction down to the Schawllow-Townes limit. Consider the two section semiconductor laser, depicted in FIG. 1. The first section, called the gain section, is the active medium and the second one, called the phase section, includes the output mirror. The phase section consists of the actual mirror which is the face of the semiconductor (possibly coated for enhanced reflectivity), and an adjacent section, which upon application of voltage changes its refractive index, and hence changes the reflectivity of the adjacent mirror. It is essential that the phase section be optically thin (in the direction of propagation of the laser beam inside the laser cavity) and that its contribution to the total phase of the electric field inside the cavity be negligibly small. The method of stabilization proposed here is based on feedback to the phase section of a voltage derived from the JV which is measured on the gain section. In general, the JV is proportional to the carrier number in the gain section. The feedback to the phase section determines the reflectivity of the mirror, and hence the loss in the cavity. Qualitatively, the method works as follows: For a positive deviation from steady state of the carrier number in the gain section, the JV is increased, followed by an increase in the reflectivity of the phase section (and hence the total number of photons in the laser cavity), causing optical saturation, and therefore a decrease in the carrier number. This mechanism defines a feedback self-stabilizing loop of the carrier number and hence the reduced fluctuations in the carrier number density give rise to reduced phase noise.

To obtain quantitative analysis of the general mechanism described above, one has to start from the coupled equations describing the laser. Using the standard equations for deviations from steady state in single mode laser we obtain $$\frac{dj}{dt} = G_N j \Delta N + \sigma_N jM - \Gamma_{jj} + F_I \quad (4)$$

$$\frac{d\Delta N}{dt} = -Gj - \Gamma_N \Delta N + F_N \quad (5)$$

$$\frac{d\Phi}{dt} = \alpha/2(G_N \Delta N - G_{jj}) + F_\Phi \quad (6)$$

Where j and $\Delta N$ are the deviation of the photon number and of the carrier density from their steady state value.

$$\Gamma_I = G_I + R/I; \Gamma_N = \gamma + G_N I \quad (7)$$

G is the gain, $G_{I,N}$ is the differential gain, $\gamma$ is the differential recombination rate.

The novelty in the current invention is in the introduction of electrically controlled reflection to the laser equations, which may be described as an additional loss which depends on carrier number fluctuations. Under the conditions defined above and in FIG. 1, we define the cavity losses we have $$\sigma(t) = \sigma - \sigma_N M \tag{8}$$

where $$M = 1/\tau_{FB} \int_{-\infty}^{t} dt_1 \exp(-(t-t_1)/\tau_{FB}) \Delta N(t_1) \tag{9}$$

$\tau_{FB}$ is characteristic time of the feedback circuit.

Eq. (4-6) can be solved by the Fourier transform method. The solution for the Fourier conjugated functions is $$\Delta N(\omega) = ((i\omega + \Gamma_I) F_N(\omega) - G F_I(\omega))/\Delta \tag{10}$$

$$j(\omega) = ((i\omega + \Gamma_N) F_I(\omega) + (G_N + \sigma_N(i\omega \tau_{FB}^{-1} + 1)^{-1}) I F_N)/\Delta \tag{11}$$

Where $$\Delta = (\Omega^3 + a\omega^2 + b\omega + c)(i\omega + \tau_{FB}^{-1}) \tag{12}$$

$$a = \Gamma_N + \Gamma_I + \tau_{FB}^{-1} \tag{13}$$

$$b = \Gamma_N \Gamma_I + (\Gamma_N + \Gamma_I)\tau_{FB}^{-1} + G G_N I \tag{14}$$

$$c = i(GI(G_N + \sigma_N)\tau_{FB}^{-1} + \Gamma_I \Gamma_N \tau_{FB}^{-1}) \tag{15}$$

To obtain the linewidth of this laser, consider $$<\Phi_{1,2}(t^2)> = Re \int_{-\infty}^{+\infty} d\omega(1 - \exp(i\omega t)) < |\Phi_{1,2}(\omega)|^2 > \tag{16}$$

and solve this integral by contour integration, closing the contour in the upper half of the complex $\omega$ plane. The poles are defined by $\omega = 0$ and by the roots of the polynomial (12).

The final result for the linewidth is:

$$(\Phi(t)^2) = R/(2I)((1 + \alpha_{eff}^2)t + \alpha^2/(2\Gamma)(1 - \exp(-\Gamma t) \cos(\Omega t)) + \alpha^2/\Gamma_0(1 - \exp(-\Gamma_0 t))) \tag{17}$$

where $$\alpha_{eff} = \alpha G_N/(G_N + \sigma_N) \tag{18}$$

$$\Gamma_0 = \Gamma_{FB}^{-1}(G_N + \sigma_N)/G_N \tag{19}$$

The structure of the expression (17) is similar to (2), with two essential differences:
(i) In the linear term the enhancement factor rescales by a factor $G_N/(G_N + \sigma_N)$, which provides for linewidth reduction when $a_{eff} < 1$.
(ii) The present expression includes a third term, whose contribution to the linewidth is negligibly small when $\alpha^2 R/(\Gamma_{00} 2I) < 1$. The last inequality gives the restriction $\tau_{FB}^{-1} \leq 2I/R\alpha_{eff}$. Using values from Table 1, we obtain $\sigma_N \geq 10^5 s^{-1}$, $\tau_{FB} \geq 10^{-8} s$.

Equations (8) and (9) are the basic results which are the foundation of the preferred embodiment of the present invention. Relation (9) defines the requirements of the feedback amplification, and gives exact prescription of how to translate the junction voltage to the required signal to be applied to the phase section of the laser. The only missing coefficient is the one that converts an external voltage to change in reflectivity, a number which is device dependent, and can be measured directly for each construction of a laser structure and therefore, is easily and readily obtainable by one skilled in the art.

TABLE 1

Typical Laser Parameters

G (stimulated emission rate) = $6 \times 10^{11} s^{-1}$
R (spontaneous emission rate) = $1.5 \times 10^{12} s^{-1}$ $$G_I = \frac{dG}{dI} = 10^5 s^{-1} s^{-1}$$

$$G_N = \frac{dG}{dN} = 5 \times 10^3 s^{-1}$$

$\gamma$ (differential recombination rate) = $6 \times 10^8 s^{-1}$
$\alpha = 5$ Although the invention has been shown and described in detail, changes and modifications are possible which do not depart from the inventive concepts taught herein. Such changes and modifications are deemed to fall within the purview of the invention.

What is claimed is:

1. A two-part semiconducting laser comprising a gain part including a junction across which a junction voltage is developed and a relatively optically thin phase part, a partially reflective mirror on the phase part, means for deriving a control signal from the junction voltage and for applying the control signal to the phase part to control the reflectivity of the mirror, wherein the means for deriving a control signal includes means for sensing the junction voltage and means for converting the sensed junction voltage to the control signal applied to the phase part.

2. A two-part semiconducting laser according to claim 1 wherein the laser is comprised of a monolithic semiconducting device with the means for deriving and applying the control signal, the gain part and the phase part all being arranged on a single semiconducting chip.

3. A two-part semiconducting laser comprising a gain part including a junction and a relatively optically thin phase part, a partially reflective mirror on the phase part, means to sense the junction voltage on the gain part, processing means for processing the sensed junction voltage and to obtain a control signal, and means for applying the control signal to the phase part to control the reflectivity of the mirror.

4. A two-part semiconducting laser according to claim 3 wherein the sensed junction voltage is processed according to the algorithm $$M = L/T_{FB} \int_{-\infty}^{t} dt_1 \exp(-(t-t_1)/\tau_{FB}) \Delta N(t_1 \nabla)$$

where $\Delta N$ is the carrier density deviation from its steady state value and $\tau_{FB}$ is the characteristic time of the feedback circuit.

5. A laser comprising a single chip of semiconducting material having a gain part including a junction and juxtaposed thereto a relatively optically thin phase part, a partially reflective mirror on the phase part from which a laser beam emanates, means to sense the junction voltage on the gain part including junction measuring terminals incorporated onto the single chip of semiconducting material, processing means for processing the sensed junction voltage and to obtain a control signal including a signal analysis circuit incorporated onto the single chip of semiconducting material, and means for applying the control signal to the phase part to control the reflectivity of the mirror including a feedback loop incorporated onto the single chip of semiconducting material.

6. A method of stabilizing a semiconductor laser including a gain part having a junction and an optically thin phase part having a partially reflective mirror comprising the steps of deriving a control signal from the junction voltage of the gain part, and applying the control signal to the phase part.

7. A method of stabilizing a semiconductor laser including a gain part having a junction and an optically thin phase part having a partially reflective mirror comprising the steps of sensing the junction voltage, deriving a control signal from the sensed junction voltage, and applying the control signal to the phase part for controlling one of the phase and frequency of the laser.

8. A method of stabilizing a semiconductor laser including a gain part having a junction and an optically thin phase part having a partially reflective mirror comprising the steps of deriving a control signal from the junction voltage of the gain part, and applying the control signal to the phase part to control one of the phase and frequency of the laser such that the linewidth of the laser is below that of a semiconducting laser at its Henry linewidth.

9. A method according to claim 8 including the further steps of preselecting the parameters of the laser and controlling the application of the control signal to provide linewidth reduction so that the laser operates substantially near its ST limit.

* * * * *

UNITED STATES PATENT AND TRADEMARK OFFICE
CERTIFICATE OF CORRECTION

PATENT NO.: 5,418,800
DATED : May 23, 1995
INVENTOR(S): Yehiam PRIOR and Boris M. CHERNOBROD It is certified that error appears in the above-identified patent and that said Letters Patent is hereby corrected as shown below:

On the title page, item [75], please correct the first name of the first inventor:

Delete "Lehiam" and insert --Yehiam--.

Column 5, line 59, delete "$a_{eff}$" and insert --$\alpha_{eff}$--;

line 62, delete "$\alpha^2 R/(\Gamma_{00} 2I) < 1$" and insert --$\alpha^2 R/(\Gamma_0 2I) < 1$--;

line 65, delete "$\tau_{FB} \geq 10^{-8} S$" and insert --$\tau_{FB} \leq 10^{-8} S$--.

Column 6, line 16, delete "$G_I = \dfrac{dG}{dI} = 10^5 s^{-1} s^{-1}$" and insert --$G_I = \dfrac{dG}{dI} = 10^5 s^{-1}$--.

line 59, delete "$M = L/T_{FB} \int_{-\infty}^{t} dt_1 \exp(-(t-t_1)/\tau_{FB}) \Delta N(t_1 \nabla)$" and insert --$M = L/T_{FB} \int_{-\infty}^{t} dt_1 \exp(-(t-t_1)/\tau_{FB}) \Delta N(t_1)$--.

Signed and Sealed this

Twenty-sixth Day of March, 1996

Attest:

BRUCE LEHMAN

*Attesting Officer*   *Commissioner of Patents and Trademarks*